March 17, 1970 JAMES E. WEBB 3,501,712
ADMINISTRATOR OF THE NATIONAL AERONAUTICS AND SPACE ADMINISTRATION
HIGH VOLTAGE TRANSISTOR CIRCUIT
Filed May 17, 1967
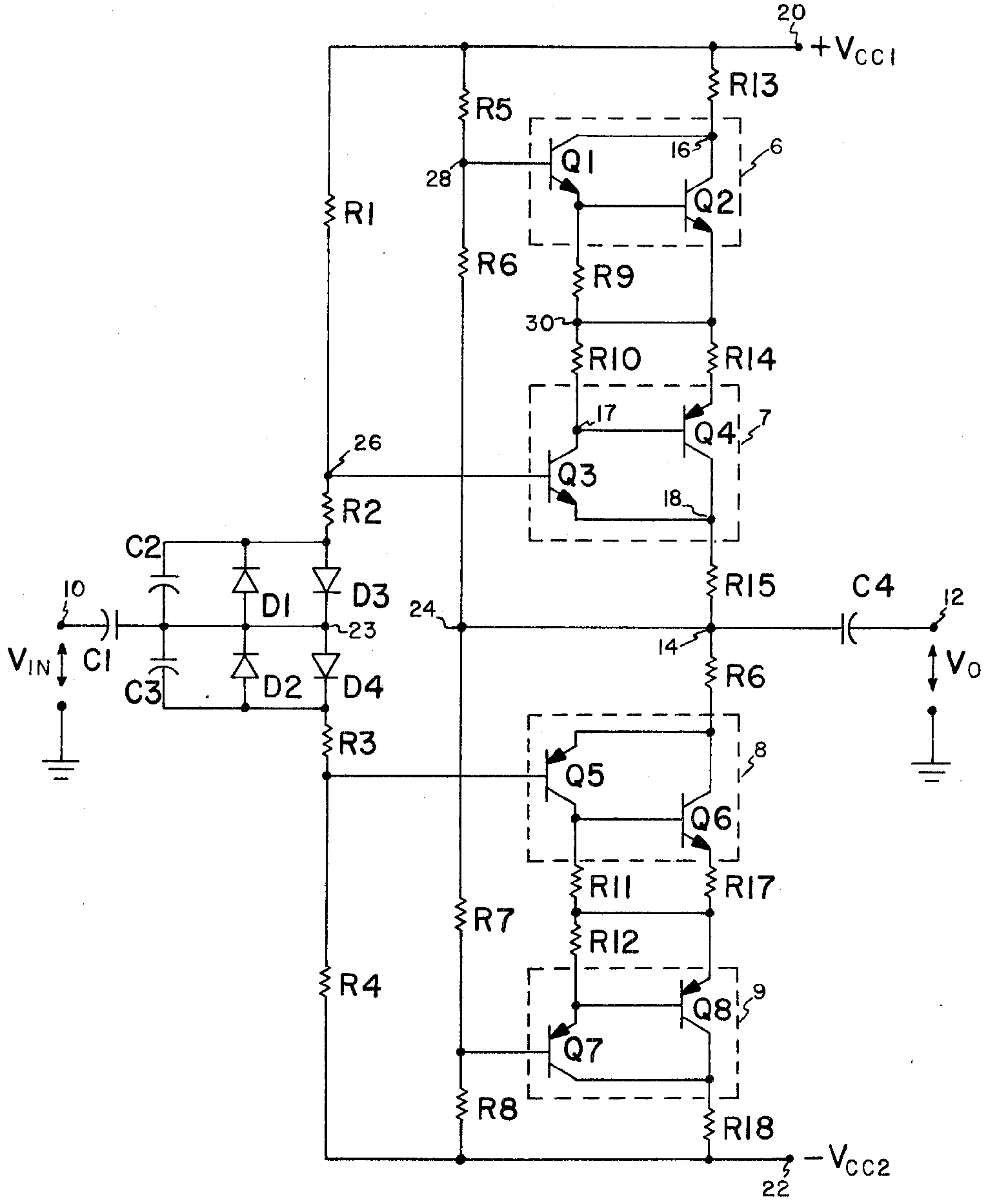
INVENTOR.
JAMES S. LEE
BY [signature]
ATTORNEYS United States Patent Office 3,501,712

Patented Mar. 17, 1970

3,501,712
HIGH VOLTAGE TRANSISTOR CIRCUIT

James E. Webb, Administrator of the National Aeronautics and Space Administration, with respect to an invention of James S. Lee, Santa Barbara, Calif.

Filed May 17, 1967, Ser. No. 640,449
Int. Cl. H03f 3/68
U.S. Cl. 330—30 5 Claims

ABSTRACT OF THE DISCLOSURE

A transistor amplifier which has two series connected transistor subcircuits for sharing the output voltage and thus enabling higher voltage operation, wherein one subcircuit is of the Darlington type and the other is a complementary pair which eliminates a base-emitter in the feedback path; the amplifier providing a high input impedance, low output impedance, and low power dissipation.

ORIGIN OF INVENTION

The invention described herein was made in the performance of work under a NASA contract and is subject to the provisions of Section 305 of the National Aeronautics and Space Act of 1958, Public Law 85–568 (72 Stat. 435; 42 USC 2457).

BACKGROUND OF THE INVENTION

This invention relates to semiconductor or transistor circuits.

In many electronics applications, a high-voltage high-frequency amplifier of simple construction is needed. However, the output voltage swing of transformerless transistor amplifiers is usually limited by the breakdown voltage of the transistors. The limitation is especially troublesome in high frequency applications because high frequency transistors typically have a low breakdown voltage. Transistor circuits have been designed which employ a series connected chain of transistors to distribute the output voltage, so that a high output voltage may be impressed across the entire chain. However, such circuits have generally required low resistance feedback and biasing resistors, and have resulted in relatively large power dissipation, high output resistance and low input resistance.

Accordingly, one object of the present invention is to provide an amplifier circuit for operation at high output voltage and high frequency, which is more efficient and more stable than amplifiers available heretofore.

Another object of the present invention is to provide an amplifier circuit utilizing semiconductor or transistor type elements which is capable of delivering high voltage outputs with less power dissipation, lower output impedance and higher input impedance than transistor circuits available heretofore.

Yet another object of the present invention is to provide a high voltage, low power-dissipation, complementary emitter follower amplifier of high voltage gain stability and high zero-signal idle current stability.

SUMMARY OF THE INVENTION

The foregoing and other objects of the invention are realized in one embodiment which is a complementary emitter follower type amplifier for class-A push-pull operation. Each complementary branch of the circuit has two series connected subcircuits, each subcircuit having about 50% of the branch voltage across it so that a high voltage can appear across the entire branch without breakdown of either subcircuit.

Instead of using a single transistor for each subcircuit, each subcircuit includes a pair of compound-connected transistors. One of the subcircuits is a Darlington connection which provides high current gain and high input resistance, thereby enabling the use of high value resistors in the feedback circuit from the amplifier output to the Darlington input, and greatly reducing power dissipation in the feedback resistors. The Darlington connection also reduces output impedance. The other subcircuit is similar to a Darlington connection but has the emitter and collector of the compound pair connected togethed instead of having the two collectors connected together. The modification from a Darlington connection results in there being only one base-emitter junction in the signal path. Two base-emitter junctions have a greater instability than a single junction, and as a result this arrangement provides better voltage gain stability and better zero-signal idle current stability than a Darlington connection, while retaining the desirable input and output impedance characteristics of the Darlington connection.

The novel features that are considered characteristic of this invention are set forth with particularity in the appended claims. The invention itself will best be understood from the following description when read in connection with the accompanying drawing.

BRIEF DESCRIPTION OF THE DRAWING

The figure is a schematic diagram of a preferred embodiment of the invention.

DESCRIPTION OF THE PREFERRED EMBODIMENT

The figure is a schematic diagram of a complementary emitter follower circuit for amplifying an alternating-current signal $V_{in}$ received between input terminal 10 and ground, and delivering an alternating current signal $V_o$ between output terminal 12 and ground. The circuit has two complementary branches to enable push-pull operation, a first branch connected between a positive voltage supply $+V_{cc1}$ and midterminal 14, and a second branch connected between a negative voltage supply $-V_{cc2}$ and the midterminal 14. The two branches are similar in construction and operation, so the circuit description of one applies to the other.

The first branch comprises a Darlington connected subcircuit 6 having transistors $Q_1$ and $Q_2$ with their collectors connected together at point 16 and with the emitter output of $Q_1$ directly connected to the base input of $Q_2$. This compound connection, commonly known as the Darlington connection, results in a high current gain or amplification of signals received at the base of $Q_1$, the amplified signals being delivered at the emitter of $Q_2$, and in a high input resistance to the base of $Q_1$. A second subcircuit 7 of the branch is a compound connection of transistors $Q_3$ and $Q_4$, wherein the emitter of $Q_3$ is connected to the collector $Q_4$ at point 18. This connection of $Q_3$ and $Q_4$ also provides high current gain and high input resistance.

The circuit power is supplied by a voltage source $+V_{cc1}$ connected at the terminal 20 of the first complementary branch and a voltage source $-V_{cc2}$ connected at the terminal 22 of the second branch. A first series-connected group of resistors $R_1$, $R_2$, $R_3$ and $R_4$, and two diodes $D_3$ and $D_4$, all of which may be referred to as an input series connection of resistors or chain of resistors, connected between the two voltage sources at terminals 20 and 22, provides biasing for the operation of input transistors $Q_3$ and $Q_5$. For $V_{cc1}=V_{cc2}$, the midpoint 23 of that group of resistors and diodes is generally at approximately zero average potential. The resistor $R_2$ is of small value compared to $R_1$; when the small voltage drop across $R_2$ is added to the voltage drop across diode $D_3$ (which is approximately equal to the base-emitter voltage of $Q_3$) there is provided a potential at point 26 which is generally enough to raise the voltage of the base of $Q_3$ to a desired operating point.

A second series-connected group of resistors $R_5$, $R_6$, $R_7$ and $R_8$, which may be referred to as a feedback series connection or chain of resistors, connected between the two voltage sources at terminals 20 and 22, provides biasing for the operation of input transistors $Q_1$ and $Q_7$. This group of resistors, because of its midpoint connection at 24 to the circuit output, also serves as part of a feedback loop. Resistor $R_5$ is of the same general magnitude as $R_6$ so the potential at point 28, which is connected to the base of $Q_1$, is at a high potential. Thus, the emitter of $Q_1$ will be at a high potential since it will be only approximately 0.6 volt below the voltage at point 28. The potential at 24 varies directly with the output voltage $V_0$, and the potential at 28 varies about half as much as point 24, thereby providing feedback to $Q_1$.

The output transistors $Q_2$ and $Q_4$ are connected in series with the voltage sources $+V_{cc1}$ and $-V_{cc2}$ and resistors $R_{13}$, $R_{14}$ and $R_{15}$ of the first branch, and with the corresponding transistors $Q_8$ and $Q_6$ and resistors $R_{18}$, $R_{17}$ and $R_{16}$ of the second branch. The change in output voltage at 14, or voltage swing caused by the first branch is due to the collector-emitter voltages across $Q_2$ and $Q_4$. The values of $R_5$ and $R_6$ are chosen so that the voltages across these transistors are nearly equal and therefore the voltage swing of the output signal at 14 can equal almost twice the breakdown voltage of either transistor $Q_2$ or $Q_4$.

Resistors $R_9$ and $R_{10}$ are stabilizing resistors for $Q_2$ and $Q_4$, respectively. Stabilization is achieved by shunting the collector leakage current of $Q_2$ through $R_9$ and the leakage current of $Q_4$ through $R_{10}$. Resistor $R_{13}$ provides short circuit protection for the first branch of the circuit and $R_{18}$ provides short circuit protection for the second branch.

The input $V_{in}$ passes through a capacitor $C_1$ at the input which prevents DC coupling. Positive excursions of $V_{in}$ raise the potential of point 23 and therefore the potential at 26, which increases the output voltage. Diode $D_2$ is provided to prevent emitter-base breakdown of $Q_3$ for input voltage swings that exceed the output voltage swing capability. For example, if $V_{in}$ has an instantaneous negative voltage which is even more negative than $-V_{cc2}$, so that the output could not follow it, then current will flow from $-V_{cc2}$ through $D_2$ to limit the negative excursion at point 23 to a maximum of approximately $-V_{cc2}$. Diode $D_1$ prevents emitter breakdown for excessive positive inputs. Capacitor $C_2$ minimizes distortion on the positive peaks of high-frequency, large swing signals. Without $C_2$ the input capacitance of $Q_3$ would cause $D_3$ to become reverse biased during the positive peaks of high frequency, large swing signals, if the product of $R_1$ and the input capacitance of $Q_3$ were comparable to the period of the waveform. $C_3$ minimizes distortion on the negative peaks of high-frequency, large swing signals in an analogous way.

The second branch is constructed complementary to the first, with $C_3$, $D_2$, $D_4$, $R_3$, $R_4$, $R_7$, $R_8$, $R_{11}$, $R_{12}$, $R_{16}$, $R_{17}$ and $R_{18}$ being equal and connected similarly to $C_2$, $D_1$, $D_3$, $R_2$, $R_1$, $R_6$, $R_5$, $R_{10}$, $R_9$, $R_{15}$, $R_{14}$ and $R_{13}$ respectively. In the second branch subcircuits 9 and 8 correspond to the subcircuits 6 and 7, respectively, of the first branch. The transistors $Q_1$, $Q_2$ and $Q_3$ are npn types with characteristics complementary to those of $Q_7$, $Q_8$ and $Q_5$ which are pnp types. Similarly, $Q_4$ is a pnp type with characteristics complementary to those of $Q_6$ which is an npn type.

Before a signal $V_{in}$ is received, $Q_2$, $Q_4$, $Q_6$ and $Q_8$ are almost cut off and, assuming $V_{cc1}$ equals $V_{cc2}$, points 14 and 24 are at zero potential. The voltage across each of the transistors $Q_2$, $Q_4$, $Q_6$ and $Q_8$ is one half $V_{cc1}$ or $V_{cc2}$. Transistors $Q_1$, $Q_3$, $Q_5$ and $Q_7$ are also almost cut off.

When a positive $V_{in}$ is received, the potential at 26 rises from a few tenths of a volt to nearly the $V_{in}$ input voltage, the collector-emitter voltage across $Q_3$ falls while the $Q_3$ emitter voltage rises. When the collector-emitter potential of $Q_3$ falls, $Q_4$ is driven further "on" so that the emitter-collector voltage across $Q_4$ falls and the potential of the $Q_4$ collector rises. The rising voltage at the collector of $Q_4$ and hence the voltage at 14 is coupled back to the base of $Q_1$ through $R_6$. Since $R_5$ and $R_6$ form a voltage divider with a division of approximately one-half, the signal voltage at the base of $Q_1$ is approximately one half that at 14. Thus, as point 14 rises, one half of this rise appears at the base of $Q_1$, and therefore at the emitter of $Q_1$. The rise at the emitter of $Q_1$ is coupled to the base of $Q_2$, and causes the emitter of $Q_2$ to rise. Since the emitter of $Q_2$ rises one half as much as point 14, the collector-emitter voltages of $Q_2$ and $Q_4$ decrease by approximately the same percentages. As the output voltages (collector-emitter) of $Q_2$ and $Q_4$ decrease, the voltage at 14 rises and the output of the circuit, delivered through $C_4$ to terminal 12, rises.

The circuit produces some cross-over distortion, as is generally found in complementary-symmetry transistor amplifiers. However, in the circuit of this invention only one base-emitter junction is in the signal path between point 14 and point 26, so cross-over distortion is reduced to a minimum and zero-signal idle current is relatively small and constant. The amount of cross-over distortion and zero-signal current instability would be increased if a Darlington connection were employed (achieved by connecting an npn $Q_4$ with its emitter at point 18 and its collector connected to resistor $R_{14}$, connecting $Q_3$ so that its emitter were at 17 and it collector were at 30, and changing resistors $R_{10}$ and $R_{14}$ to open and short circuits, respectively).

The input impedances of the subcircuits $Q_1$, $Q_2$ and subcircuits $Q_3$, $Q_4$ approximate the $h_{FE}$ product of each of the two transistors times the load impedance at the output of each respective subcircuit. The output impedance of each is lower than that of a single transistor, since the output impedance of each subcircuit is the source impedance divided by the $h_{FE}$ product. Higher input impedances enable the use of large resistors $R_5$ and $R_6$ which deliver current to $Q_1$ and a large $R_1$ which supplies current that flows to $Q_3$, and therefore the dissipation of power in these resistors is small.

One embodiment of the invention has been constructed utilizing the particular transistors and other components designated in the following table, all resistors being ½ watt, 5% tolerance types except $R_1$ and $R_4$ which are of 1% tolerance and $R_{13}$ and $R_{18}$ which are 1 watt types. All capacitors are of a non-polar type.

| Component: | Characteristic |
|---|---|
| $R_1$ | 21.5K ohms—1% tolerance. |
| $R_2$ | 39 ohms. |
| $R_3$ | 39 ohms. |
| $R_4$ | 21.5K ohms—1% tolerance. |
| $R_5$ | 3.9K ohms. |
| $R_6$ | 4.7K ohms. |
| $R_7$ | 4.7K ohms. |
| $R_8$ | 3.9K ohms. |
| $R_9$ | 1K ohms. |
| $R_{10}$ | 1K ohms. |
| $R_{11}$ | 1K ohms. |
| $R_{12}$ | 1K ohms. |
| $R_{13}$ | 33 ohms—1 watt. |
| $R_{14}$ | 10 ohms. |
| $R_{15}$ | 10 ohms. |
| $R_{16}$ | 10 ohms. |
| $R_{17}$ | 10 ohms. |
| $R_{18}$ | 33 ohms—1 watt. |

| Component: | Characteristic |
|---|---|
| $C_1$ | 15 microfarads. |
| $C_2$ | 0.001 microfarads. |
| $C_3$ | 0.001 microfarads. |
| $C_4$ | 1000 microfarads. |
| $D_1$ | Type 1N914. |
| $D_2$ | Type 1N914. |
| $D_3$ | Type 1N914. |
| $D_4$ | Type 1N914. |
| $Q_1$ | Type 2N2218A. |
| $Q_2$ | Type 2N2218A. |
| $Q_3$ | Type 2N2218A. |
| $Q_4$ | Type 2N2904A. |
| $Q_5$ | Type 2N2904A. |
| $Q_6$ | Type 2N2218A. |
| $Q_7$ | Type 2N2904A. |
| $Q_8$ | Type 2N2904A. |

The circuit was connected to voltage sources wherein $+V_{cc}=+40$ volts and $-V_{cc}=-40$ volts, and was operated with large input voltages such as 60 volts peak-to-peak. The circuit has been found to display low power dissipation and low output impedance, in addition to high input impedance and good stability. It should be understood, of course, that the specific component values are merely illustrative and should not be considered as limiting the scope of the invention.

While a particular circuit embodying the invention has been described in detail, various modifications will occur to skilled circuit designers which utilize the teachings of the invention. Accordingly, the invention is not limited to the particular embodiment described and illustrated, but only by a just interpretation of the following claims.

What is claimed is:

1. An amplifying circuit comprising:
an output terminal;
a plurality of output transistors having their emitters and collectors connected in series, said plurality of output transistors connected to said output terminal;
a plurality of input transistors, each having an output connected substantially directly to one of said output transistors;
biasing means connected to said plurality of input transistors for establishing operating points of said plurality of output transistors wherein approximately the same maximum voltage appears across each output transistor;
an input terminal;
means for connecting said input terminal to at least one of said input transistors, to form a high input impedance and at least one path between said input and output terminals with a single emitter base junction in said path;
the connection of a first of said input transistors to one of said output transistors includes the direct connection of the collector of the input transistor to the base of the output transistor and the direct connection of the emitter of the input transistor to the collector of the output transistor;
the connection of a second of said input transistors to one of said output transistors includes the direct connection of the collectors of said transistors and the direct connection of the emitter of the input transistor to the base of the output transistor; and
said biasing means includes a first chain of resistors at least one of which is connected between said input terminal and the base of said first of said input transistors, and a second chain of resistors at least one of which is connected between said output terminal and the base of said second of said input transistors, the resistors in said second chain being in the range of several thousand ohms.

2. A transistorized amplifying circuit comprising:
an input terminal for receiving an input signal;
an output terminal; and
at least one circuit branch coupled to said input terminal and to said output terminal to amplify the input signal and apply it at said output terminal, said circuit branch including;
first, second and third transistors of a first conductivity type and a fourth transistor of a second, opposite conductivity type, each transistor having base, collector and emitter electrodes,
first means for connecting said second and fourth transistors in series between a potential source and said output terminal, with the collector emitter junction of said second transistor in series with the emitter collector junction of said fourth transistor,
second means for directly connecting the collector and emitter of said first transistor to the collector and base of said second transistor respectively,
third means including resistive means for connecting the base of said first transistor to a potential which is a function of the potential difference between said source and the potential at said output terminal,
and fourth means for connecting said third transistor to said input terminal, to said output terminal, and to said fourth transistor to provide a high input impedance to said fourth transistor and to provide only a single emitter-base junction of said third transistor between the output and input terminals, said fourth means include a first resistor connected between said input terminal and the base of said third transistor, a second resistor connected at one end to said output terminal and at its opposite end to both the emitter and collector of said third and fourth transistors, respectively, and said circuit branch further including a third resistor connected between the base of said third transistor and said potential source.

3. The arrangement as recited in claim 2 wherein said third means include fourth and fifth resistors connected in series between said output terminal and said potential source, and means connecting the base of said first transistor to the junction point of said fourth and fifth resistors whose relative resistive values control the relative changes in the collector-emitter potentials of said second and fourth transistors, so as to control the maximum emitter potentials not to exceed the breakdown potential of either of said second and fourth transistors.

4. The arrangement as recited in claim 3 wherein the resistance of each of said fourth and fifth resistors is in the range of several thousand ohms, to minimize power losses therein.

5. The arrangement as recited in claim 4 wherein said circuit includes another circuit branch, complementary said one circuit branch, and including first, second and third transistors of said second conductivity type and a fourth transistor of said first conductivity type, said another circuit branch including a terminal connectable to a second potential source.

References Cited

UNITED STATES PATENTS

| | | | |
|---|---|---|---|
| 2,896,029 | 7/1959 | Lin | 330—13 |
| 2,981,895 | 4/1961 | Koch | 330—19 X |

ROY LAKE, Primary Examiner

LAWRENCE J. DAHL, Assistant Examiner

U.S. Cl. X.R.

330—17